(12) United States Patent
Li et al.

(10) Patent No.: US 10,894,738 B2
(45) Date of Patent: Jan. 19, 2021

(54) WAVELENGTH CONVERSION DEVICE AND METHOD FOR MANUFACTURING THE SAME

(71) Applicant: APPOTRONICS CORPORATION LIMITED, Shenzhen (CN)

(72) Inventors: Qian Li, Guangdong (CN); Yanzheng Xu, Guangdong (CN)

(73) Assignee: APPOTRONICS CORPORATION LIMITED, Shenzhen (CN)

( * ) Notice: Subject to any disclaimer, the term of this patent is extended or adjusted under 35 U.S.C. 154(b) by 89 days.

(21) Appl. No.: 16/317,106

(22) PCT Filed: Apr. 28, 2017

(86) PCT No.: PCT/CN2017/082416
§ 371 (c)(1),
(2) Date: Jan. 11, 2019

(87) PCT Pub. No.: WO2018/010470
PCT Pub. Date: Jan. 18, 2018

(65) Prior Publication Data
US 2019/0241462 A1    Aug. 8, 2019

(30) Foreign Application Priority Data
Jul. 13, 2016    (CN) .......................... 2016 1 0551131

(51) Int. Cl.
*C03C 4/12*    (2006.01)
*G02B 5/02*    (2006.01)
(Continued)

(52) U.S. Cl.
CPC .............. *C03C 4/12* (2013.01); *C03C 14/004* (2013.01); *C09K 11/02* (2013.01);
(Continued)

(58) Field of Classification Search
CPC ...... C03C 4/12; C03C 14/004; C03C 2204/00; C03C 2214/04; C03C 14/006; G02B 5/02;
(Continued)

(56) References Cited

U.S. PATENT DOCUMENTS

2003/0111644 A1* 6/2003 Chen ................. C09K 11/7706
                                                      252/301.4 R
2015/0097165 A1* 4/2015 Setz ........................ C03C 8/20
                                                            257/40
(Continued)

FOREIGN PATENT DOCUMENTS

CN    102442782 A    5/2012
CN    102574727 A    7/2012
(Continued)

OTHER PUBLICATIONS

Office Action, Japanese Patent Application No. 2019-501929, dated Dec. 18, 2019.
(Continued)

*Primary Examiner* — Michael Maskell
(74) *Attorney, Agent, or Firm* — Marshall, Gerstein & Borun LLP

(57) ABSTRACT

A wavelength conversion device, comprising a light-emitting layer, a reflection layer, and a substrate layer stacked upon each other in that order. The light-emitting layer comprises a wavelength conversion material and a first glass powder. The reflection layer comprises a reflection particle and a second glass powder. The second glass powder has a smaller particle diameter compared to the first glass powder. The technical solution achieves equivalent softening of the reflection layer and light-emitting layer in a sintering process for manufacturing the wavelength conversion device, thereby overcoming the issue of inadequate softening of the (Continued)

reflection layer and improving an adhesive strength between the reflection layer and the substrate layer.

20 Claims, 1 Drawing Sheet

(51) Int. Cl.
*H01L 33/50* (2010.01)
*G02B 26/00* (2006.01)
*C03C 14/00* (2006.01)
*C09K 11/02* (2006.01)
*C09K 11/77* (2006.01)

(52) U.S. Cl.
CPC ............ *C09K 11/7774* (2013.01); *G02B 5/02* (2013.01); *G02B 5/0242* (2013.01); *G02B 5/0284* (2013.01); *G02B 26/00* (2013.01); *H01L 33/50* (2013.01); *C03C 2204/00* (2013.01); *C03C 2214/04* (2013.01)

(58) Field of Classification Search
CPC .... G02B 26/00; G02B 5/0242; G02B 5/0284; H01L 33/50; C09K 11/02; C09K 11/7774
USPC .......................................... 250/493.1–504 R
See application file for complete search history.

(56) References Cited

U.S. PATENT DOCUMENTS

| | | | |
|---|---|---|---|
| 2016/0002528 A1* | 1/2016 | Tsumori | F21V 3/04 362/84 |
| 2016/0123557 A1 | 5/2016 | Xu et al. | |
| 2016/0266375 A1* | 9/2016 | Li | G02B 26/008 |

FOREIGN PATENT DOCUMENTS

| | | | |
|---|---|---|---|
| CN | 203489180 U | 3/2014 | |
| CN | 103717544 A | 4/2014 | |
| CN | 203932671 U | 11/2014 | |
| CN | 104566229 A | 4/2015 | |
| CN | 104953014 A | 9/2015 | |
| CN | 105278225 A | 1/2016 | |
| CN | 105322433 A | 2/2016 | |
| CN | 105693108 A | 6/2016 | |
| EP | 3006823 A1 | 4/2016 | |
| EP | 3059492 A1 | 8/2016 | |
| JP | H4369509 A | 12/1992 | |
| JP | 2013228598 A | 11/2013 | |
| JP | 2015-215583 A | 12/2015 | |
| JP | 2016009127 A | 1/2016 | |
| WO | WO-2013159664 A1 | 10/2013 | |
| WO | WO-2015055088 A1 * | 4/2015 | ........... G03B 21/204 |
| WO | WO-2015055089 A1 | 4/2015 | |

OTHER PUBLICATIONS

Search Report for application No. EP17826809.0, dated Dec. 19, 2019.

International Search Report for International Application PCT/CN2017/082416, dated Jul. 26, 2017.

First Office Action for Application No. CN 201610551131.8 issued by The State Intellectual Property Office of People's Republic of China, dated Jan. 19, 2020.

Second Office Action for Application No. CN 201610551131.8 issued by The State Intellectual Property Office of People's Republic of China, dated Oct. 13, 2020

* cited by examiner

WAVELENGTH CONVERSION DEVICE AND METHOD FOR MANUFACTURING THE SAME

CROSS-REFERENCE TO RELATED APPLICATIONS

This is the United States national phase of International Patent Application No. PCT/CN2017/082416 filed Apr. 28, 2017, which claims priority to Chinese Patent Application No. 201610551131.8, filed Jul. 13, 2016, the contents of each of which are incorporated herein by reference in their entireties.

TECHNICAL FIELD

The present disclosure relates to the field of illumination and display technologies, and in particular, to a wavelength conversion device and a method for manufacturing the wavelength conversion device.

BACKGROUND

Laser fluorescent powder technology has become a most promising mainstream laser light source technology. It mainly uses blue laser to excite high-speed rotating fluorescent color wheel to obtain fluorescent emergent light, which can effectively solve the problem of heat quenching of fluorescent powder and obtain a high-efficiency and low-cost laser light source which has been successfully applied to various areas of laser display.

SUMMARY

Technical Problem to be Solved

An organic system fluorescent color wheel in which an organic silica gel is used as a binder has been gradually replaced by an inorganic system fluorescent color wheel in which an inorganic material is used as a binder or vehicle, because the organic system fluorescent color wheel cannot withstand high-intensity laser irradiation. FIG. 1 is a schematic structural diagram showing a wavelength conversion device of a fluorescent color wheel in the prior art. As shown in FIG. 1, the wavelength conversion device 100 includes a light-emitting layer 101 composed of a fluorescent powder and a glass powder, a reflection layer 102 composed of an inorganic white powder and a glass powder, and a substrate layer 103. Generally, the light-emitting layer 101 and the reflection layer 102 are co-sintered in order to obtain a better bonding effect of the two layers. However, since a particle size of the inorganic white powder in the reflection layer 102 is small, a softening temperature of the reflection layer 102 rises when the inorganic white powder is mixed with the glass powder, resulting in inconsistency between the softening temperature of the light-emitting layer 101 and the softening temperature of the reflection layer 102. This results in a different degree of expansion/contraction of the light-emitting layer 101 and the reflection layer 102 during the co-sintering process. In order to prevent the light-emitting layer 101 from being excessively liquefied and then deforming, the reflection layer 102 shall have a low degree of liquefaction and a small shrinkage, so that an adhesion force between the reflection layer 102 and the substrate layer 103 decreases, thus causing a possibility that the reflection layer 102 is detached.

Solution to the Problem

In view of the defect of poor adhesion force between the reflection layer and the substrate layer in the prior art, the present disclosure provides a wavelength conversion device with enhanced bonding force between layers. The wavelength conversion device includes a light-emitting layer, a reflection layer and a substrate layer stacked on each other in that order, the light-emitting layer comprises a wavelength conversion material and a first glass powder, the reflection layer comprises reflection particles and a second glass powder, and the second glass powder has an average particle size smaller than an average particle size of the first glass powder.

Preferably, the first glass powder and the second glass powder are of a same type.

Preferably, the average particle size of the first glass powder is 3 μm to 5 μm, and the average particle size of the second glass powder is 0.5 μm to 1 μm.

Preferably, the first glass powder comprises silicate glass, lead silicate glass, aluminoborosilicate glass, aluminate glass, soda-lime glass, or quartz glass.

Preferably, the reflection particles comprise aluminum oxide particles, titanium oxide particles, barium sulfate particles, magnesium oxide particles, aluminum nitride particles, or any combination thereof.

Preferably, the reflection particles comprise aluminum oxide particles and titanium oxide particles.

Preferably, the aluminum oxide particles have an average particle size of 0.5 μm to 2 μm, and the titanium oxide particles have an average particle size of 1 μm to 5 μm.

Preferably, the wavelength conversion material comprises at least one of a YAG fluorescent powder and a LuAG fluorescent powder.

Preferably, the wavelength conversion material has an average particle size of 10 μm to 30 μm.

Preferably, the wavelength conversion material is present in 10% to 80% by mass of the light-emitting layer, and the reflection particles are present in 10% to 90% by mass of the reflection layer.

Preferably, the substrate layer is a ceramic substrate layer, and the ceramic substrate layer is an aluminum nitride substrate layer, an aluminum oxide substrate layer, a silicon carbide substrate layer or a silicon nitride substrate layer.

The present disclosure further provides a method for manufacturing a wavelength conversion device. The method includes the following steps:

S1: uniformly mixing a wavelength conversion material, a first glass powder and an organic vehicle to obtain a light-emitting layer slurry;

S2: uniformly mixing reflection particles, a second glass powder and an organic vehicle to obtain a reflection layer slurry, wherein the second glass powder has a particle size smaller than a particle size of the first glass powder; and S3: brushing and drying the reflection layer slurry on the substrate layer, brushing and drying the light-emitting layer slurry on the dried reflection layer slurry, and sintering a substrate layer covering with the dried reflection layer slurry and the dried light-emitting layer slurry, so as to obtain a wavelength conversion device.

Preferably, the first glass powder and the second glass powder are of a same type, the first glass powder has an average particle size of 3 μm to 5 μm, and the second glass powder has an average particle size of 0.5 μm to 1 μm.

Preferably, the organic vehicle comprises silicone oil of various systems such as phenyl-based silicone oil and methyl-based silicone oil; or ethanol, ethylene glycol, xylene, ethyl cellulose, terpineol, butyl carbitol, polyvinyl alcohol, polyvinyl butyral, poly propionic acid, and polyethylene glycol, or any mixture thereof.

Preferably, the reflection particles comprise aluminum oxide particles, titanium oxide particles, barium sulfate particles, magnesium oxide particles, aluminum nitride particles, or any combination thereof.

Preferably, the wavelength conversion material comprises at least one of a YAG fluorescent powder and a LuAG fluorescent powder, and the wavelength conversion material has an average particle size of 10 μm to 30 μm.

Beneficial Effect

Compared with the related art, the present disclosure at least has the following beneficial effects.

In the present disclosure, glass is used as a binder in both the light-emitting layer and the reflection layer for bonding the functional materials—the wavelength conversion material and the reflection particle, except that the particle size of the first glass powder in the light-emitting layer is larger than that of the second glass powder in the reflection layer. When present alone, the second glass powder with the small particle size in the reflection layer can enter a liquid phase at a lower temperature compared with the first glass powder with a large particle size in the light-emitting layer. On the other hand, under the influence of the reflection particle, the softening temperature of the second glass powder with small particle size is increased. Therefore, the second glass powder with small particle size in the reflection layer has a softening temperature comparable to that of the first glass powder in the light-emitting layer under the dual influence of its own particle size and the reflection particle, so that the softening degree of the reflection layer is comparable to the softening degree of the light-emitting layer during a sintering process for manufacturing the wavelength conversion device, thus overcoming the defect that the softening degree of the reflection layer is insufficient, and significantly improving the adhesion force between the reflection layer and the substrate layer.

DETAILED DESCRIPTION

Figure 1:
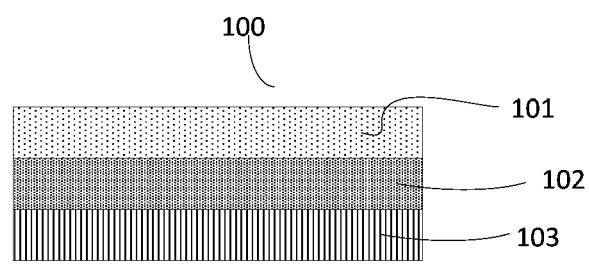
FIG. 1 is a schematic structural diagram showing a wavelength conversion device in the prior art.

The technical solutions of the present disclosure solves a problem of inconsistency in softening degree and shrinkage of the light-emitting layer and the reflection layer of the wavelength conversion device during a manufacturing process and subsequent reliability problem, but are not limited to solve only the above problem.

In the technical solutions of the present disclosure, the wavelength conversion device is composed of a light-emitting layer, a reflection layer and a substrate layer stacked on each other in that order. The reflection layer serves as an intermediate layer, which is required to have both a good bonding with the light-emitting layer and a firm adhesion with the substrate layer. Both the light-emitting layer and the reflection layer can be prepared by sintering, and co-sintering the two can improve the adhesive strength, the stability and the production efficiency. The substrate layer remains physically and chemically stable during the manufacturing process of the wavelength conversion device, and the bonding between the reflection layer and the substrate layer is mainly achieved by the binder in the reflection layer. The raw material of the binder in the reflection layer is a glass powder which has no adhesion property at normal temperature but softens and becomes a substance having certain fluidity and bonding property when heated to a certain temperature, and then contacts and adheres to the surface of the substrate layer. When the temperature is lowered, the glass binder connects to form an integral glass, thereby bonding the reflection layer and the substrate layer together.

It can be known from the above that the bonding degree between the reflection layer and the substrate layer depends on the bonding degree between the glass and the surface of the substrate layer, and further depends on the size of a contact surface between the glass and the substrate layer at a high temperature. A higher softening degree of the glass powder in the reflection layer corresponds to better fluidity of the glass, and then more surface of the substrate layer can be overspread by the glass. However, in the actual manufacturing process, the reflection layer and the light-emitting layer are sintered together, and the reflection particles in the reflection layer increases the difficulty in softening the reflection layer; if the reflection layer is softened to a degree sufficient to form a firm bonding to the substrate layer, the light-emitting layer would be excessively softened and have excessive fluidity, damaging the morphology of the light-emitting layer. If the difficulty in softening the reflection layer is reduced by reducing a proportion of the reflection particles, the reflectance of the reflection layer would be lowered.

Therefore, the present disclosure contemplates that the softening temperature of the reflection layer is lowered by changing the average particle size of the glass powder in the reflection layer without changing the softening temperature of the light-emitting layer, so that the softening temperatures of the two layers are close to each other, thereby achieving both advantages of the respective stable morphologies of the light-emitting layer and the reflection layer, and the firm bonding between the reflection layer and the substrate layer, and making great progress.

The embodiments of the present disclosure are described in detail below with reference to the accompanying drawings and the following embodiments.

Figure 2:
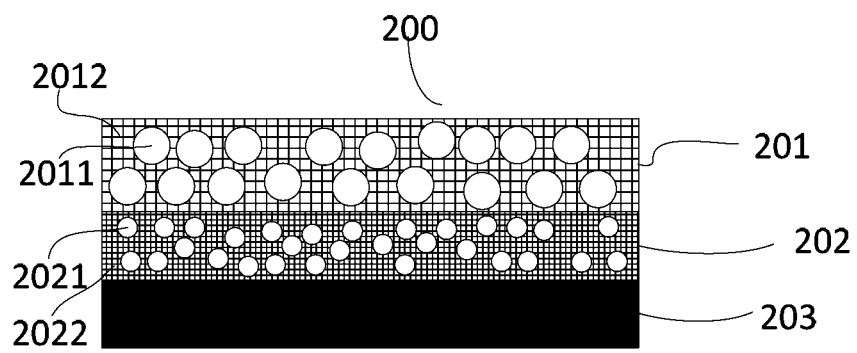
FIG. 2 is a schematic structural diagram showing a wavelength conversion device according to an embodiment of the present disclosure.

Referring to FIG. 2, FIG. 2 is a schematic structural diagram showing a wavelength conversion device according to an embodiment of the present disclosure. The wavelength conversion device 200 includes a light-emitting layer 201, a reflection layer 202, and a substrate layer 203. The light-emitting layer 201 includes a wavelength conversion material 2011 and a first glass powder 2012. The reflection layer 202 includes reflection particles 2021 and a second glass powder 2022. The average particle size of the second glass powder 2022 is smaller than the average particle size of the first glass powder 2012.

In an embodiment, the first glass powder and the second glass powder are of a same type. If different types of glass powders are used, it is difficult for them to match each other due to the performance difference thereof. Also, other problems such as difference in viscosity after softening may also be present for different types of glass powders. Of course, in some more complicated designs, the first glass powder and the second glass powder can be different types of glass powders, as long as they have more or less the same softening temperature under a same particle size.

In an embodiment, the first glass powder has an average particle size of 3 μm to 5 μm, and the second glass powder has an average particle size of 0.5 μm to 1 μm. The glass powder having smaller particle size can enter a liquid phase earlier than the glass powder having larger particle size. This is because the glass powder having smaller particle size has a larger specific surface area, and its surface energy is high, and it can enter the liquid phase at a lower temperature.

In an embodiment, the first glass powder is one of silicate glass, lead silicate glass, aluminoborosilicate glass, aluminate glass, soda-lime glass and quartz glass; and the second glass powder is one of silicate glass, lead silicate glass, aluminoborosilicate glass, aluminum oxidete glass, soda-lime glass and quartz glass. These glass powders have good bonding property and good light transmittance to visible light, and is suitable for application conditions of the wavelength conversion device of the present disclosure.

In an embodiment, the reflection particles 2021 in the reflection layer 202 are aluminum oxide particles. The aluminum oxide particles have a small absorption coefficient for visible light and can well reflect and scatter visible light. In other embodiments of the present disclosure, the reflection particles may be other white inorganic particles such as titanium oxide particles, barium sulfate particles, magnesium oxide particles and aluminum nitride particles. The reflection particles 2021 are characterized in that their melting point is much higher than the softening temperature of the glass powder. After the reflection particles 2021 and the glass powder are mixed together, the softening temperature of the glass powder is increased relative to the glass powder present alone. In another embodiment of the present disclosure, the reflection particles 2021 are a combination of aluminum oxide particles and titanium oxide particles. The titanium oxide particles have a good reflectance for light having a wavelength of more than 550 nm, and a slightly lower reflectance for short-wave visible light. The aluminum oxide particles have excellent reflectance for blue light, especially light having a wavelength of less than 480 nm. It is quite easy for the combination of the above two kinds of particles to form a film and fill the gaps between them, so that a high reflectance can be achieved with an extremely small thickness. In other embodiments of the present disclosure, a combination of other white inorganic particles may also be selected as the reflection particles.

Further, when a combination of the aluminum oxide particles and the titanium oxide particles is selected as the reflection particles, the aluminum oxide particles have an average particle size of 0.5 μm to 2 μm, and the titanium oxide particles have an average particle size of 1 μm to 5 μm. With these particle sizes, on the one hand, the reflection particles are sufficiently and uniformly mixed with the second glass powder; on the other hand, the reflection particles have good filling effect, which can improve reflectivity of the reflection layer. In an embodiment of the present disclosure, the average particle size of the reflection particles 2021 is generally in a range of 0.2 μm to 6 μm, which allows the reflection layer to satisfy the desired reflection characteristics, and meanwhile increases the softening temperature of the glass powder after the glass powder is mixed with the reflection particles due to the micro-nano scale effect of the reflection particles 2021 on the glass powder.

In an embodiment, the wavelength conversion material 2011 in the light-emitting layer 201 is a fluorescent powder, more specifically, a lanthanide-doped YAG fluorescent powder or a LuAG fluorescent powder, such as Ce:YAG and so on. Such a fluorescent powders have a stable structure and a good thermal stability and can withstand a high temperature much higher than the softening temperature and melting temperature of the glass powder. In other embodiments, the wavelength conversion material 2011 may be a quantum dot wavelength conversion material. However, it should be noted that the quantum dot wavelength conversion material should be packaged with glass or other high temperature resistant materials, because the quantum dot has a thermal stability inferior to that of the fluorescent powder and thus is easy to be destroyed.

In an embodiment, the wavelength conversion material 2011 has an average particle size of 10 μm to 30 μm. The wavelength conversion material with this particle size has higher light conversion efficiency compared with the fluorescent powder having a small particle size. Further, the fluorescent powder having a small particle size may also cause reduction of the softening temperature of the light-emitting layer 201, which then causes the insufficient softening of the reflection layer 202.

In this embodiment, the wavelength conversion material 2011 is present in 10% to 80% by mass of the light-emitting layer 201, and the reflection particles 2021 are present in 10% to 90% by mass of the reflection layer 202. Under such mass fractions, the requirements for the optical function of the light-emitting layer 201 or the reflection layer 202 can be satisfied; and the first glass powder and the second glass powder can function well to bond the materials into respective layers.

In an embodiment, the substrate layer 203 is a ceramic substrate layer made of aluminum nitride. The substrate layer 203 has good thermal conductivity and mechanical property, and can have a good bonding with the glass powder of the reflection layer 202. In other embodiments of the present disclosure, the substrate layer 203 may also be other ceramic substrate layers, such as an aluminum oxide substrate layer, a silicon carbide substrate layer, or a silicon nitride substrate layer.

The present disclosure also provides an embodiment of a method for manufacturing the wavelength conversion device. The method includes the following steps.

S1: a wavelength conversion material, a first glass powder and an organic vehicle are uniformly mixed to obtain a light-emitting layer slurry.

S2: reflection particles, a second glass powder and an organic vehicle are uniformly mixed to obtain a reflection layer slurry. The second glass powder has a particle size smaller than a particle size of the first glass powder.

S3: the reflection layer slurry is brushed on the substrate layer, and then dried. The light-emitting layer slurry is brushed on the dried reflection layer slurry, and then dried. The substrate layer covered by the dried reflection layer slurry and the dried light-emitting layer slurry is sintered, so as to obtain a wavelength conversion device.

In this embodiment, a basic concept is to manufacture a wavelength conversion device with a method of co-sintering the reflection layer and the light-emitting layer. The substrate layer serves as a coating support layer and a sintering support layer, has a good mechanical property and resistance to high temperature, and does not react with the reflection layer or the light-emitting layer.

In the mixing steps S1 and S2, the light-emitting layer slurry is obtained by mixing the wavelength conversion material, the first glass powder and the organic vehicle; and the reflecting layer slurry is obtained by mixing the reflecting particles, the second glass powder and the organic vehicle.

The wavelength conversion material may adopt the wavelength conversion materials described in the above embodiments, such as a fluorescent powder, a quantum dot material, especially a lanthanide-doped YAG fluorescent powder or a LuAG fluorescent powder, such as Ce:YAG and the like. These fluorescent powders have a stable structure and good thermal stability, and can withstand a high temperature much higher than the softening temperature and melting temperature of the glass powder. The adopted wavelength conversion material has an average particle size of 10 μm to 30 μm.

The reflection particles may adopt the reflection particles described in the above embodiments, for example, the reflection particles include aluminum oxide particles, titanium oxide particles, barium sulfate particles, magnesium oxide particles, aluminum nitride particles, or any combination thereof, which are not elaborated here. Similarly, herein the first glass powder and the second glass powder are of a same type. The first glass powder has an average particle size of 3 μm to 5 μm, and the second glass powder has an average particle size of 0.5 μm to 1 μm.

In this embodiment, the organic vehicle is configured to uniformly mix the wavelength conversion material with the first glass powder or uniformly mix the reflection particles and the second glass powder. The organic vehicle includes silicone oil of various systems such as a phenyl-based silicon oil and a methyl-based silicon oil; or ethanol, ethylene glycol, xylene, ethyl cellulose, terpineol, butyl carbitol, polyvinyl alcohol, polyvinyl butyral, polypropionic acid, polyethylene glycol, or any mixture thereof. During the drying and sintering processes, the organic vehicle volatilizes or is decomposed, and only a very small portion remains in the wavelength conversion device.

The wavelength conversion device described in the embodiments of the present disclosure can be used as a fixed light-emitting device, such as a car headlight, a wavelength conversion device for special illumination, and a laser irradiation wavelength conversion device which emits excited light for illumination. The wavelength conversion device described in the embodiment can also be used as a component of a fluorescent wheel, for exciting a rotating fluorescent wheel irradiated by light to emit excited light, and such florescent wheel can be used for a light source of a display system such as a projector and a television.

The various embodiments in the present specification are described in a progressive manner, each embodiment focuses on differences from other embodiments, and the same or similar parts between the various embodiments may be referred to one another.

The above description is merely the embodiments of the present disclosure, and is not intended to limit the scope of the present disclosure. The equivalent structures or equivalent process variations according to the specification and the drawings of the present disclosure, or direct or indirect applications in other related technical fields are all included in the protection scope of the present disclosure.

What is claimed is:

1. A wavelength conversion device, comprising: the wavelength conversion device comprises: a light-emitting layer, a reflection layer and a substrate layer stacked on each other in that order, wherein the light-emitting layer comprises a wavelength conversion material and a first glass powder, the reflection layer comprises reflection particles and a second glass powder, and the second glass powder has an average particle size smaller than an average particle size of the first glass powder in such a manner that softening temperatures of the light-emitting layer and the reflection layer are close to each other, wherein the light-emitting layer is bonded to the reflection layer and the substrate by co-sintering the light-emitting layer and the reflection layer on the substrate.

2. The wavelength conversion device according to claim 1, wherein the first glass powder and the second glass powder are of a same type.

3. The wavelength conversion device according to claim 2, wherein the average particle size of the first glass powder is 3 μm to 5 μm, and the average particle size of the second glass powder is 0.5 μm to 1μm.

4. The wavelength conversion device according to claim 2, wherein the first glass powder comprises silicate glass, lead silicate glass, aluminoborosilicate glass, aluminate glass, soda-lime glass, or quartz glass.

5. The wavelength conversion device according to claim 1, wherein the reflection particles comprise aluminum oxide particles, titanium oxide particles, barium sulfate particles, magnesium oxide particles, aluminum nitride particles, or any combination thereof.

6. The wavelength conversion device according to claim 1, wherein the reflection particles comprise aluminum oxide particles and titanium oxide particles.

7. The wavelength conversion device according to claim 6, wherein the aluminum oxide particles have an average particle size of 0.5 μm to 2 μm, and the titanium oxide particles have an average particle size of 1 μm to 5 μm.

8. The wavelength conversion device according to claim 1, wherein the wavelength conversion material comprises at least one of a YAG fluorescent powder and a LuAG fluorescent powder.

9. The wavelength conversion device according to claim 8, wherein the wavelength conversion material has an average particle size of 10 μm to 30 μm.

10. The wavelength conversion device according to claim 1, wherein the wavelength conversion material is present in 10% to 80% by mass of the light-emitting layer, and the reflection particles are present in 10% to 90% by mass of the reflection layer.

11. The wavelength conversion device according to claim 1, wherein the substrate layer is a ceramic substrate layer, and the ceramic substrate layer is an aluminum nitride substrate layer, an aluminum oxide substrate layer, a silicon carbide substrate layer or a silicon nitride substrate layer.

12. A method for manufacturing a wavelength conversion device, comprising the following steps:
    S1: uniformly mixing a wavelength conversion material, a first glass powder and an organic vehicle to obtain a light-emitting layer slurry;
    S2: uniformly mixing reflection particles, a second glass powder and an organic vehicle to obtain a reflection layer slurry, wherein the second glass powder has a particle size smaller than a particle size of the first glass powder in such a manner that softening temperatures of the light-emitting layer and the reflection layer are close to each other; and
    S3: brushing and drying the reflection layer slurry on a substrate layer, brushing and drying the light-emitting layer slurry on the dried reflection layer slurry, and sintering the substrate layer covered by the dried reflection layer slurry and the dried light-emitting layer slurry, so as to obtain the wavelength conversion device.

13. The method according to claim 12, wherein the first glass powder and the second glass powder are of a same type, the first glass powder has an average particle size of 3 μm to 5 μm, and the second glass powder has an average particle size of 0.5 μm to 1 μm.

14. The method according to claim 12, wherein the organic vehicle comprises silicone oil; or ethanol, ethylene glycol, xylene, ethyl cellulose, terpineol, butyl carbitol, polyvinyl alcohol, polyvinyl butyral, poly propionic acid, polyethylene glycol, or any mixture thereof.

15. The method according to claim 12, wherein the reflection particles comprise aluminum oxide particles, titanium oxide particles, barium sulfate particles, magnesium oxide particles, aluminum nitride particles, or any combination thereof.

16. The method according to claim 12, wherein the wavelength conversion material comprises at least one of a YAG fluorescent powder and a LuAG fluorescent powder, and the wavelength conversion material has an average particle size of 10 μm to 30 μm.

17. The method according to claim 13, wherein the organic vehicle comprises silicone oil; or ethanol, ethylene glycol, xylene, ethyl cellulose, terpineol, butyl carbitol, polyvinyl alcohol, polyvinyl butyral, poly propionic acid, polyethylene glycol, or any mixture thereof.

18. The method according to claim 13, wherein the reflection particles comprise aluminum oxide particles, titanium oxide particles, barium sulfate particles, magnesium oxide particles, aluminum nitride particles, or any combination thereof.

19. The method according to claim 13, wherein the wavelength conversion material comprises at least one of a YAG fluorescent powder and a LuAG fluorescent powder, and the wavelength conversion material has an average particle size of 10 μm to 30 μm.

20. The method according to claim 14, wherein the silicone oil comprises phenyl-based silicone oil and methyl-based silicone oil.

\* \* \* \* \*